United States Patent
Ogle et al.

(10) Patent No.: US 6,689,682 B1
(45) Date of Patent: Feb. 10, 2004

(54) MULTILAYER ANTI-REFLECTIVE COATING FOR SEMICONDUCTOR LITHOGRAPHY

(75) Inventors: Robert B. Ogle, San Jose, CA (US); Tuan Duc Pham, San Jose, CA (US); Marina V. Plat, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 176 days.

(21) Appl. No.: 09/924,670

(22) Filed: Aug. 7, 2001

Related U.S. Application Data

(60) Provisional application No. 60/224,689, filed on Aug. 11, 2000.

(51) Int. Cl.[7] .................. H01L 21/4763; H01L 21/00; H01L 21/302
(52) U.S. Cl. .................. 438/636; 438/72; 438/720; 438/735; 438/742
(58) Field of Search ................. 438/636, 637, 438/735, 737, 738, 72, 736, 720, 742

(56) References Cited

U.S. PATENT DOCUMENTS

| | | | | |
|---|---|---|---|---|
| 5,710,067 A | * | 1/1998 | Foote et al. ............. | 438/636 |
| 5,918,147 A | * | 6/1999 | Filipiak et al. ........... | 438/636 |
| 6,165,895 A | * | 12/2000 | Lin ........................ | 438/633 |
| 6,174,810 B1 | * | 1/2001 | Islam et al. ............. | 438/687 |
| 6,399,424 B1 | * | 6/2002 | Matsuura et al. ........ | 438/125 |
| 6,440,753 B1 | * | 8/2002 | Ning et al. .............. | 438/3 |
| 6,465,312 B1 | * | 10/2002 | Yu ......................... | 438/300 |
| 6,468,896 B2 | * | 10/2002 | Rohr et al. .............. | 438/637 |

* cited by examiner

*Primary Examiner*—Matthew Smith
*Assistant Examiner*—Chuong A Luu
(74) *Attorney, Agent, or Firm*—Farjami & Farjami LLP

(57) ABSTRACT

A multilayer electrically conductive stack is formed in a semiconductor device prior to one step of photolithography. In this multilayer electrically conductive stack, alternate layers of the stack contain materials that differ in their refractive indices. In one instance, the electrically conductive stack can serve as an anti-reflective coating in the photolithographical processing. As the electrically conductive stack has chemical and electrical properties similar to those of an underlying device structures, removal of the multilayer stack after the photolithographical step is not required. In one instance, the electrically conductive stack can be used to form a gate structure or an interconnect structure. In an embodiment of the invention, alternate layers consist of $Si_{1-x}Ge_x$ and Si, respectively.

6 Claims, 3 Drawing Sheets

MULTILAYER ANTI-REFLECTIVE COATING FOR SEMICONDUCTOR LITHOGRAPHY

This application claims the benefit of Ser. No. 60/224,689, filed Aug. 11, 2000.

BACKGROUND OF THE INVENTION

1. Field of the Invention

The present invention relates to semiconductor device processing. More particularly, the present invention relates to an anti-reflective coating used in connection with photolithography in semiconductor device processing.

2. Discussion of the Related Art

Use of an anti-reflective coating in photolithographic processing of semiconductor devices is described, for example, in U.S. Pat. No. 5,710,067 by Foote et al., issued Jan. 20, 1998. By suppressing multiple reflections and interferences that otherwise produce diffusely and nonuniformly illuminated lithographic exposure, an anti-reflective coating permits sharper and higher resolution lithographic exposure and patterning, thus allowing higher device densities to be achieved. An anti-reflective coating can be applied, for example, in photolithographically forming contacts and vias to gate electrodes.

A conventional anti-reflective coating for photolithography includes various inorganic and organic materials, such as amorphous silicon, silicon nitride, silicon oxynitride, α-carbon, titanium nitride, silicon carbide, silicon oxide, spin-on polyimides and polysulfones. Typically, a single-layer anti-reflective coating is used, although multilayer coatings offer predicted superior performance. A multilayer coating, however, presents complexities in deposition and removal, which can result in trace contaminants (e.g., nitrogen poisoning) that degrade device performance.

FIG. 1A is a split cross-sectional schematic diagram of a conventional semiconductor device structure 100. In the left hand portion of FIG. 1A, an oxide layer 104 is formed, typically using LOCOS technology, at a principal surface 106 of a semiconductor substrate 102. Overlying oxide layer 104 is typically deposited an electrically conductive layer 110. Deposited overlying conductive layer 110 is typically a dielectric layer 112. A conventional anti-reflective coating 114, containing, for example, silicon nitride, is then deposited overlying dielectric layer 112. A photoresist layer 120 is deposited over conventional anti-reflective coating 114.

The right hand portion of FIG. 1A shows semiconductor device 100 at a later stage of processing than that shown in the left hand portion of FIG. 1A. Photoresist layer 120 is selectively exposed and patterned. Anti-reflective coating 114 suppresses multiple reflections and interferences, enabling sharp edge resolution at the boundaries between exposed and unexposed portions of photoresist layer 120. Exposed portions of dielectric layer 112 are then etched through patterned photoresist layer 120, exposing a portion of the surface of electrically conductive layer 110 and substantially preserving the sharp edge resolution established between exposed and unexposed portions of photoresist layer 120.

FIG. 1B is a split cross-sectional schematic diagram of semiconductor device 100 at a later processing stage than that shown in FIG. 1A. After removal of excess photoresist 120, as shown in the left hand portion of FIG. 1B, an electrically conductive structure 122 is formed overlying the exposed surface of electrically conductive layer 110 within the cavity etched into dielectric layer 112. Subsequent processing steps, e.g., formation of an electrically conductive layer 124 overlying dielectric layer 112, typically require prior removal of any residual traces of anti-reflective coating 114, as shown in the right hand portion of FIG. 1B.

SUMMARY OF THE INVENTION

In accordance with the present invention, a multilayer electrically conductive stack is formed over a surface in a semiconductor device prior to a photolithographical step. Alternate layers of the stack, having chemical and electrical characteristics similar to those of an underlying device structure, contain materials that differ in their refractive indices. A photoresist layer is deposited over the multilayer anti-reflective stack, and patterned. During an exposure step in the patterning, the multilayer anti-reflective stack effectively suppresses multiple reflections and interferences from an underlying structure in the semiconductor device, thus providing sharpened edge resolution in the patterning. Consequently, high device density can be achieved.

Because the multilayer anti-reflective stack has chemical and electrical compatibility with an adjacent conductive material of the semiconductor device, removal of the remaining multilayer stack after the photolithographical step is not required. Therefore the multilayer stack advantageously remains in place during subsequent processing steps and in the final device, where it forms all or a part of an electrically conductive device structure (e.g., a gate or an interconnect structure).

In an embodiment of the invention, alternate layers of $Si_{1-x}Ge_x$ and Si can be provided as a multilayer stack (e.g., 2 to 10 layers).

The present invention is better understood upon consideration of the detailed description below, in conjunction with the accompanying drawings.

BRIEF DESCRIPTION OF THE DRAWINGS

For simplicity and ease of understanding, the use of similar reference symbols in different drawings indicates similar or identical items.

DETAILED DESCRIPTION OF THE PREFERRED EMBODIMENTS

In accordance with the present invention, materials and processes are devised, which allow the use of high performance multilayer anti-reflective coatings for photolithographic semiconductor device processing, without the drawbacks and complexities of conventional anti-reflective coating materials and methods. In an embodiment of the invention, anti-reflective coating materials that are chemically and electrically compatible with a semiconductor device material are selected, so that such an anti-reflective coating formed adjacent to such semiconductor device material need not be removed after photolithographic patterning and etching. In a preferred embodiment, a multilayer anti-reflective coating comprises alternating layers of Si and SiGe. (In this description, the term "SiGe" broadly represents any compound of Si and Ge, i.e., $Si_{1-x}Ge_x$, where x is between 0.1 and 1). These materials are chemically and electrically substantially similar to polysilicon (i.e., belonging to Group IV of the periodic table of elements), and have appropriate optical transparency and refractive index differential in a wavelength range that includes ultraviolet illumination sources of current interest for high device density photolithography (e.g., KrF and ArF excimer lasers). Since the multilayer anti-reflective coating is made of electrically conductive materials, such a coating can be used also as an electrically conductive device structure (e.g., a gate structure or an interconnect structure).

Figure 1A:
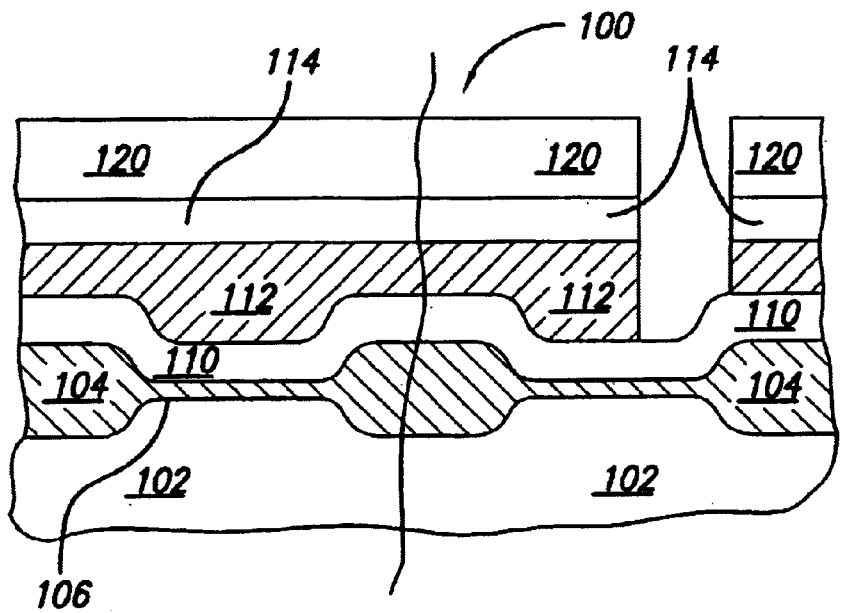
FIG. 1A is a split cross-sectional schematic diagram of a conventional semiconductor device structure.
Figure 1B:
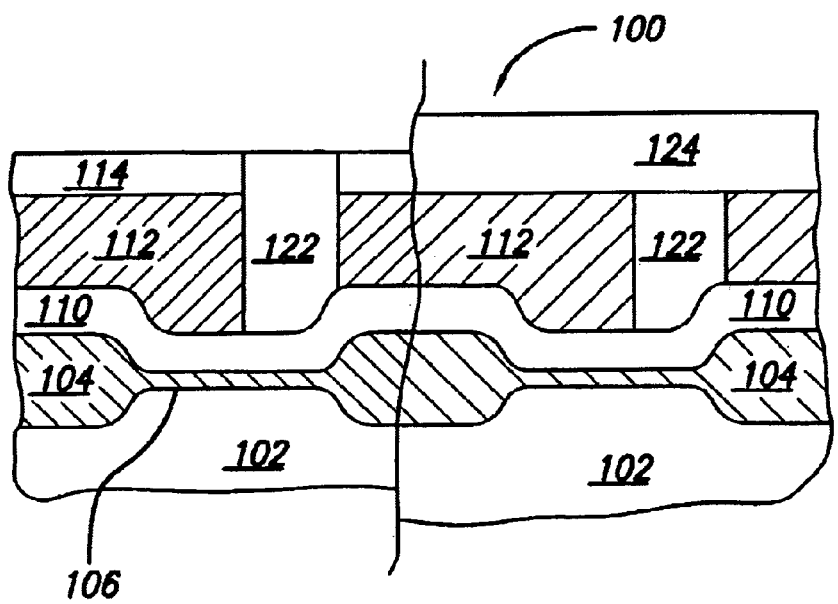
FIG. 1B is a split cross-sectional schematic diagram of the semiconductor device shown in FIG. 1A at a later processing stage.
Figure 2A:
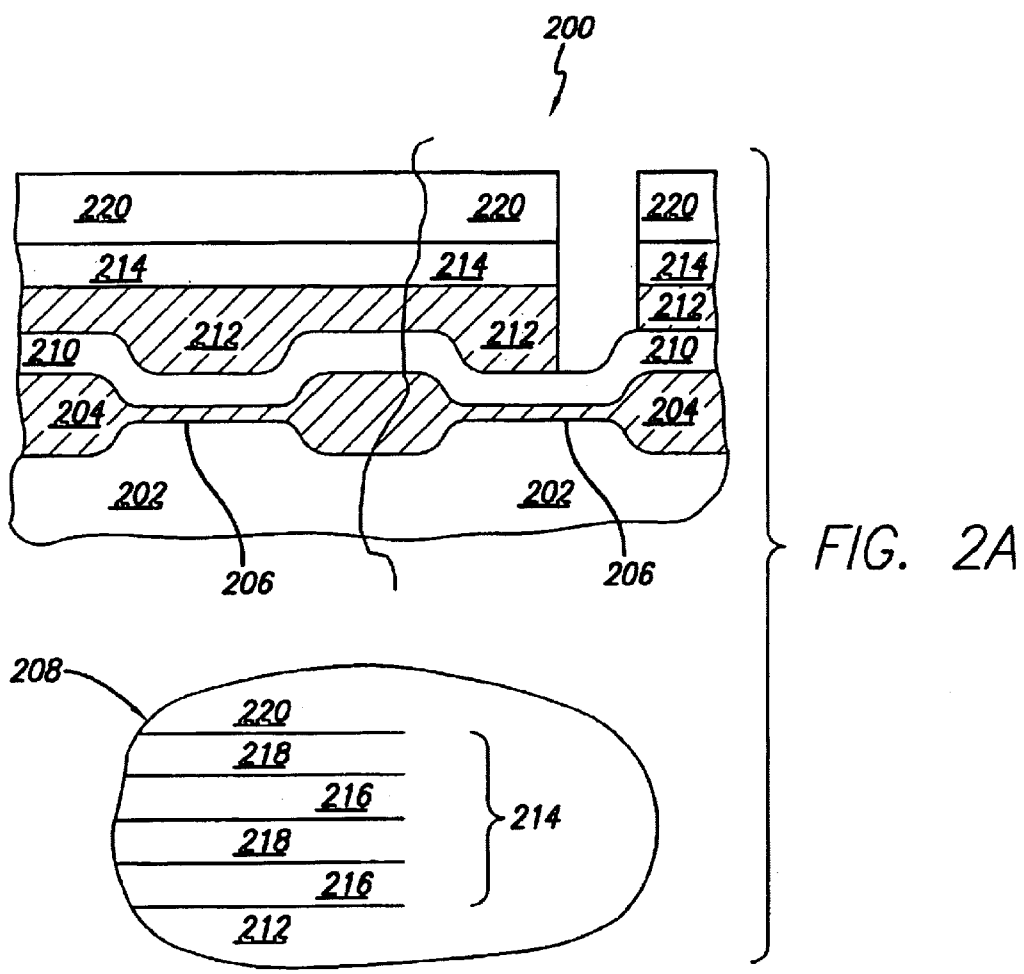
FIG. 2A is a split cross-sectional schematic diagram of a semiconductor device at a stage of processing, including a multilayer anti-reflective coating in accordance with the invention.

FIG. 2A is a split cross-sectional schematic diagram of a semiconductor device 200 at a stage of processing, including a multilayer anti-reflective coating, in accordance with the invention. In the left hand portion of FIG. 2A, an oxide layer 204 is formed (using, for example, a LOCOS technique) at a principal surface 206 of semiconductor substrate 202. Over oxide layer 204 is deposited an electrically conductive layer 210. Deposited over conductive layer 210 is a dielectric layer 212. A multilayer anti-reflective coating 214, containing, for example, alternate layers of SiGe 216 and Si 218, as shown in detail 208, are then deposited overlying dielectric layer 212. Alternating layers of SiGe 216 and Si 218 are typically deposited using a conventional deposition technology (e.g., chemical vapor deposition). The number of individual layers 216, 218 in multilayer anti-reflective coating 214 can vary, for example, between two and ten layers. Photoresist layer 220 is deposited over multilayer anti-reflective coating 214.

The right hand portion of FIG. 2A shows semiconductor device 200 at a later stage of processing than that shown in the left hand portion of FIG. 2A. Photoresist layer 220 is selectively exposed and patterned. Multilayer anti-reflective coating 214 suppresses multiple reflections and interferences, providing sharp edge resolution at the boundaries between exposed and unexposed portions of photoresist layer 220. Exposed portions of dielectric layer 212 are then etched through patterned photoresist layer 220, exposing a portion of the surface of electrically conductive layer 210 and substantially preserving the sharp edge resolution established between exposed and unexposed portions of photoresist layer 220.

Figure 2B:
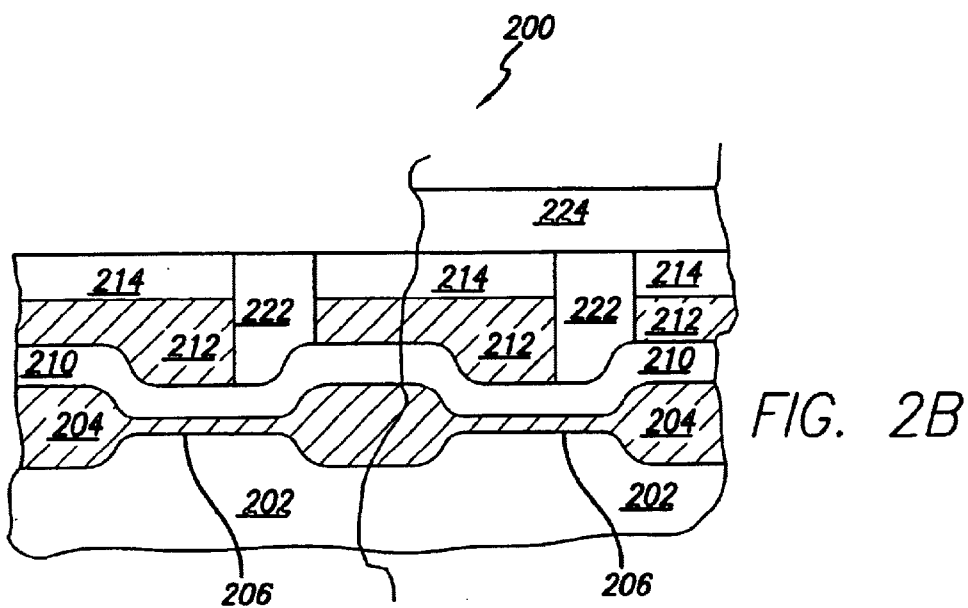
FIG. 2B is a split cross-sectional schematic diagram of the semiconductor device shown in FIG. 2A at a later processing stage.

FIG. 2B is a split cross-sectional schematic diagram of semiconductor device 200 at a later processing stage than that shown in FIG. 2A. After removal of excess photoresist 220, as shown in the left hand portion of FIG. 2B, a structure, typically an electrically conductive structure 222 is formed overlying the exposed surface of electrically conductive layer 210 within the cavity etched into dielectric layer 212. As shown in the right hand portion of FIG. 2B, subsequent processing steps involving further electrically conductive layers, e.g., conductive layer 224, can then be performed on semiconductor device 200 without removing multilayer anti-reflective coating 214, since the properties of Si and SiGe in anti-reflective coating 214 are already electrically and chemically compatible with further electrically conductive layers. The above method, according to the invention, provides the photolithographic advantages of multilayer anti-reflective coatings for high resolution and high device densities without the complexity resulting from material removal that could degrade semiconductor device performance.

Figure 3:
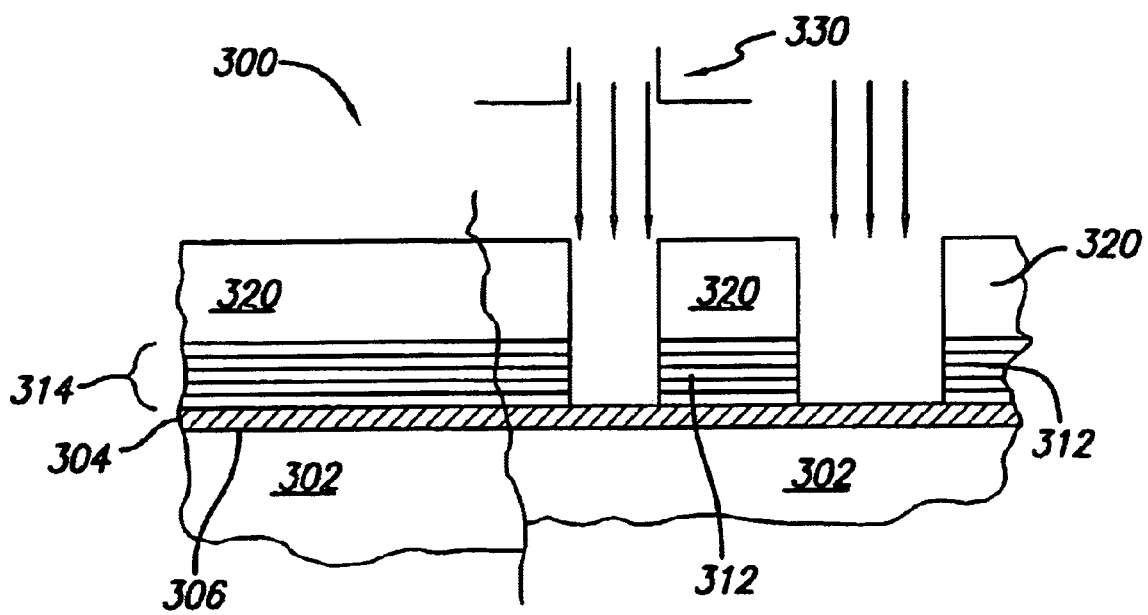
FIG. 3 is a split cross-sectional schematic diagram showing a semiconductor device at a stage of fabrication, according to a further embodiment of the invention.

FIG. 3 is a split cross-sectional schematic diagram showing a semiconductor device 300 at a stage of fabrication, according to a further embodiment of the invention. An oxide layer 304 is formed, typically by thermal oxidation, overlying a principal surface 306 of a semiconductor substrate 302. A multilayer electrically conductive coating 314 is formed overlying oxide layer 304. A photoresist layer 320 is deposited overlying multilayer electrically conductive coating 314 and is exposed imagewise by a photolithographic source 330. Multilayer electrically conductive coating 314 comprises a plurality of alternate layers 216 and 218 (see FIG. 2A) having similar electrical properties but differing optical refractive indices in the wavelength range of photolithographic source 330. For example, alternate layers 216 and 218 are SiGe and Si, respectively. Multilayer electrically conductive coating 314 are provided thicknesses, which may be empirically determined, such that reflections and interferences of photolithographic source 330 are suppressed. Exposed photoresist layer 320 is developed to provide a pattern, through which multilayer electrically conductive coating 314 is etched to form an electrically conductive device structure, e.g., a layered gate structure 312, retaining the multilayer character of multilayer electrically conductive coating 314. In this fashion, multilayer electrically conductive coating 314 performs the dual purposes of providing an anti-reflective coating and a gate structure 312.

While specific embodiments of the present invention have been shown and described, changes and modifications to these illustrative embodiments can be made without departing from the present invention in its broader aspects. Thus it should be evident that there are other embodiments of this invention which, while not expressly described above, are within the scope of the present invention. The present invention is set forth in the following claims.

What is claimed is:

1. A method of making a semiconductor device, comprising:

forming an electrically conductive structure;

forming a plurality of adjacent electrically conductive layers over said electrically conductive structure, each pair of said adjacent electrically conductive layers comprising respectively a first material and a second material having a differing refractive index in a preselected wavelength range relative to said first material, wherein said electrically conductive structure and said first and said second materials each comprise an element of the same group in the periodic table;

providing a photoresist layer above said electrically conductive layers;

patterning said photoresist layer to expose portions of a surface of said electrically conductive layers;

forming a structure by etching said electrically conductive layer and said electrically conductive structure at said portions; and removing remaining photoresist of said photoresist layer from said semiconductor device.

2. A method as in claim 1, wherein said adjacent electrically conductive layers suppress multiple reflections and interferences during said patterning.

3. The method of claim 1, wherein said structure comprises a gate.

4. The method of claim 1, wherein said structure comprises an interconnect.

5. The method of claim 1, wherein said first material comprises $Si_{1-x}Ge_x$ and said second material comprises Si.

6. The method of claim 1, wherein the number of layers of said plurality of adjacent electrically conductive layers is less than 11.

* * * * *